US012049695B2

(12) United States Patent
Vrtis et al.

(10) Patent No.: US 12,049,695 B2
(45) Date of Patent: Jul. 30, 2024

(54) COMPOSITIONS AND METHODS USING SAME FOR DEPOSITION OF SILICON-CONTAINING FILM

(71) Applicant: Versum Materials US, LLC, Tempe, AZ (US)

(72) Inventors: Raymond Nicholas Vrtis, Tempe, AZ (US); William Robert Entley, Tempe, AZ (US); Robert Gordon Ridgeway, Tempe, AZ (US); Xinjian Lei, Tempe, AZ (US); John Francis Lehmann, Tempe, AZ (US); Manchao Xiao, Tempe, AZ (US)

(73) Assignee: Versum Materials US, LLC, Tempe, AZ (US)

( * ) Notice: Subject to any disclaimer, the term of this patent is extended or adjusted under 35 U.S.C. 154(b) by 0 days.

(21) Appl. No.: 16/134,410

(22) Filed: Sep. 18, 2018

(65) Prior Publication Data
US 2019/0017167 A1 Jan. 17, 2019

Related U.S. Application Data

(62) Division of application No. 15/520,326, filed as application No. PCT/US2015/057040 on Oct. 23, 2015, now Pat. No. 10,106,890.

(60) Provisional application No. 62/068,248, filed on Oct. 24, 2014.

(51) Int. Cl.
*H01L 21/02* (2006.01)
*C23C 16/34* (2006.01)
*C23C 16/36* (2006.01)
*C23C 16/40* (2006.01)
*C23C 16/48* (2006.01)
*C23C 16/50* (2006.01)

(52) U.S. Cl.
CPC .......... *C23C 16/401* (2013.01); *C23C 16/345* (2013.01); *C23C 16/36* (2013.01); *C23C 16/48* (2013.01); *C23C 16/50* (2013.01); *H01L 21/02126* (2013.01); *H01L 21/02164* (2013.01); *H01L 21/02211* (2013.01); *H01L 21/02216* (2013.01); *H01L 21/02219* (2013.01); *H01L 21/02222* (2013.01); *H01L 21/02271* (2013.01); *H01L 21/02274* (2013.01); *H01L 21/0228* (2013.01); *H01L 21/02326* (2013.01); *H01L 21/02337* (2013.01); *H01L 21/0234* (2013.01); *H01L 21/02348* (2013.01)

(58) Field of Classification Search
CPC ..... C23C 16/401; C23C 16/345; C23C 16/36; C23C 16/48; C23C 16/50; H01L 21/02126; H01L 21/02164; H01L 21/02211; H01L 21/02216; H01L 21/02219
See application file for complete search history.

(56) References Cited

U.S. PATENT DOCUMENTS

| 5,413,813 A * | 5/1995 | Cruse .................. C07F 7/21 427/237 |
| 5,424,095 A * | 6/1995 | Clark .................. C23C 16/30 427/237 |
| 5,968,611 A | 10/1999 | Kaloyeros et al. |
| 11,078,569 B2 * | 8/2021 | Lei .................. C23C 16/45542 |
| 2002/0016084 A1 | 2/2002 | Todd |
| 2002/0133035 A1 * | 9/2002 | Asai .................. C08G 77/08 556/467 |
| 2004/0127667 A1 * | 7/2004 | Worley .............. C07F 7/1804 528/10 |
| 2005/0239295 A1 * | 10/2005 | Wang .................. G02B 6/138 438/780 |
| 2006/0194916 A1 * | 8/2006 | Zhong ................ C08G 77/38 524/588 |
| 2007/0261600 A1 * | 11/2007 | Zhong ................ C08G 77/20 528/12 |
| 2009/0191722 A1 | 7/2009 | Hasebe et al. |
| 2009/0298298 A1 * | 12/2009 | Aoi .................. C23C 16/401 524/588 |
| 2010/0009546 A1 * | 1/2010 | Weigel .............. C23C 18/122 106/287.11 |
| 2010/0104755 A1 * | 4/2010 | Dussarrat ............ C23C 16/34 427/255.394 |
| 2011/0262642 A1 * | 10/2011 | Xiao ................ H01L 21/31608 427/255.394 |

(Continued)

FOREIGN PATENT DOCUMENTS

CN    102191479 A    9/2011
CN    102534548 A    7/2012

(Continued)

OTHER PUBLICATIONS

Beckers, Helmut, et al., "Siloxanes and silylamines with fluoromethyl-methylsilicon groups: X-ray study of [CH2F(CH3) SiO]4". Journal of Organometallic Chemistry 511 (1996) 293-298.*
Itami, Yujiro, et al., "Functionalization of Vinyl-Substituted Cyclosiloxane and Cyclosilazane via Ruthenium-Catalyzed Silylative Coupling Reaction". Organometallics 2003, 22, 3717-3722.*
Scantlin, William M., et al., "The Borane-Catalyzed Condensation of Trisilazane and N-Methyldisilazane". Inorganic Chemistry, vol. 11, No. 12, 1972, pp. 3082-3084.*
Laermer, F., et al., "Bosch deep silicon etching: Improving uniformity and etch rate for advanced MEMS applications". Proceedings of the IEEE Micro Electro Mechanical Systems (MEMS). 1999, 211-216. 10.1109/MEMSYS.1999.746812.*

(Continued)

*Primary Examiner* — Bret P Chen
(74) *Attorney, Agent, or Firm* — Daniel Roth

(57) ABSTRACT

Compositions for forming a silicon-containing film such as without limitation a silicon oxide, silicon nitride, silicon oxynitride, a carbon-doped silicon nitride, or a carbon-doped silicon oxide film on at least a surface of a substrate having a surface feature. In one aspect, the composition comprises at least one compound is selected from the group consisting of a siloxane, a trisilylamine-based compound, and a cyclic trisilazane compound.

12 Claims, 2 Drawing Sheets

(56) References Cited

U.S. PATENT DOCUMENTS

| | | | |
|---|---|---|---|
| 2012/0118619 A1* | 5/2012 | Booth, Jr. | H01L 21/31116 174/257 |
| 2012/0190212 A1* | 7/2012 | Samukawa | C23C 16/486 524/588 |
| 2012/0220139 A1 | 8/2012 | Lee et al. | |
| 2012/0276306 A1* | 11/2012 | Ueda | C23C 16/40 427/576 |
| 2012/0280200 A1* | 11/2012 | Tada | H01L 45/04 257/4 |
| 2013/0118895 A1* | 5/2013 | Roozeboom | H01J 37/32623 204/192.34 |
| 2013/0209343 A1* | 8/2013 | Korolev | C01B 21/087 423/324 |
| 2013/0252161 A1* | 9/2013 | Kawakami | G03G 9/09716 430/108.3 |
| 2013/0260575 A1* | 10/2013 | Al-Rashid | H01L 21/02211 438/789 |
| 2013/0319290 A1* | 12/2013 | Xiao | H01L 21/02211 106/287.11 |
| 2013/0323435 A1* | 12/2013 | Xiao | C09D 1/00 427/579 |
| 2013/0330935 A1* | 12/2013 | Varadarajan | H01L 21/02216 438/786 |
| 2014/0057458 A1* | 2/2014 | Park | H01L 21/02222 438/790 |
| 2014/0120738 A1* | 5/2014 | Jung | C23C 16/45536 438/778 |
| 2014/0256100 A1 | 9/2014 | Lam et al. | |
| 2015/0004317 A1* | 1/2015 | Dussarrat | B05D 1/60 427/255.6 |
| 2016/0009088 A1* | 1/2016 | Nagamochi | B41J 2/14088 347/61 |
| 2016/0079034 A1* | 3/2016 | Yieh | H01L 21/02321 427/526 |
| 2016/0156066 A1* | 6/2016 | Gleason | H01M 10/0565 429/311 |
| 2016/0336174 A1* | 11/2016 | Underwood | H01L 21/02274 |

FOREIGN PATENT DOCUMENTS

| | | | | |
|---|---|---|---|---|
| CN | 103450242 A | * | 12/2013 | |
| EP | 0654544 B1 | * | 1/1998 | C23C 16/32 |
| JP | 2009-500864 A | | 1/2009 | |
| JP | 2009-246405 | * | 10/2009 | H01L 21/316 |
| JP | 2014-013889 A | | 1/2014 | |
| JP | 2014-132653 A | | 7/2014 | |
| KR | 20070052761 A | | 5/2007 | |
| WO | WO 2004/016670 A2 | * | 2/2004 | |
| WO | WO 2004/113417 A1 | * | 12/2004 | C08G 77/38 |
| WO | WO 2016/065221 A1 | * | 4/2016 | C23C 16/40 |

OTHER PUBLICATIONS

Weinhold, Frank, et al., "The Nature of the Silicon-Oxygen Bond". Organometallics 2011, 30, 5815-5824.*

Deng, Yu-Luen, et al., "Polydimethyl siloxane wet etching for three dimensional fabrication of microneedle array and high-aspect-ratio micropillars". Biomicrofluidics 8, 026502 (2014), pp. 1-6.*

Sawama, Yoshinari, et al., "Disiloxane Synthesis Based on Silicon-Hydrogen Bond Activation using Gold and Platinum on Carbon in Water or Heavy Water". Journal of Organic Chemistry 2016, 81, 4190-4195.*

Kim, Honggun, et al. "Novel Flowable CVD Process Technology for Sub-20nm Interlayer Dielectrics." Copyright 2012, IEEE.

* cited by examiner

COMPOSITIONS AND METHODS USING SAME FOR DEPOSITION OF SILICON-CONTAINING FILM

CROSS REFERENCE TO RELATED APPLICATIONS

This application is a divisional of U.S. application Ser. No. 15/520,326, filed on Apr. 19, 2017, now U.S. Pat. No. 10,106,890, which is a U.S. National Stage entry of International Patent Application No. PCT/US15/57040, filed on Oct. 23, 2015, which, in turn, claims the benefit of priority under 35 U.S.C. § 119(e) to U.S. provisional Application No. 62/068,248, filed on Oct. 24, 2014, the disclosures of which are hereby incorporated by reference in their entirety.

BACKGROUND OF THE INVENTION

Described herein is a process for the fabrication of an electronic device. More specifically, described herein are compositions for forming a silicon-containing film in a deposition process, such as, without limitation, a flowable chemical vapor deposition. Exemplary silicon-containing films that can be deposited using the compositions and methods described herein include, without limitation, silicon oxide, silicon nitride, silicon oxynitride or carbon-doped silicon oxide or carbon-doped silicon nitride films.

Flowable oxide deposition methods typically use alkoxysilane compounds are as precursors for silicon-containing films which are deposited by controlled hydrolysis and condensation reactions. Such films can be deposited onto a substrate, for example, by applying a mixture of water and alkoxysilanes, optionally with solvent and/or other additives such as surfactants and porogens, onto a substrate. Typical methods for the application of these mixtures include, without limitation, spin coating, dip coating, spray coating, screen printing, co-condensation, and ink jet printing. After application to the substrate and upon application of one or more energy sources such as, without limitation thermal, plasma, and/or other sources, the water within the mixture can react with the alkoxysilanes to hydrolyze the alkoxide and/or aryloxide groups and generate silanol species, which further condense with other hydrolyzed molecules and form an oligomeric or network structure.

Besides physical deposition or application of the precursor to the substrate, vapor deposition processes using water and a silicon containing vapor source for flowable dielectric deposition (FCVD) have been described, for instance, in U.S. Pat. Nos. 8,481,403; 8,580,697; 8,685,867; US Publ. No. 2013/0230987 A1; 7,498,273; 7,074,690; 7,582,555; 7,888,233; and 7,915,131. Typical methods generally relate to filling gaps on substrates with a solid dielectric material by forming a flowable film in the gap. The flowable film is formed by reacting a dielectric precursor which may have a Si—C bond with an oxidant to form the dielectric material. In certain embodiments, the dielectric precursor condenses and subsequently reacts with the oxidant to form dielectric material. In certain embodiments, vapor phase reactants react to form a condensed flowable film. Since the Si—C bond is relatively inert towards reaction with water, the resultant network may be beneficially functionalized with organic functional groups which impart desired chemical and physical properties to the resultant film. For example, the addition of carbon to the network may lower the dielectric constant of the resultant film.

Another approach to depositing a silicon oxide film using flowable chemical vapor deposition process is gas phase polymerization. For example, the prior art has focused on using compounds such as trisilylamine (TSA) to deposit Si, H, N containing oligomers that are subsequently oxidized to SiOx films using ozone exposure. Examples of such approaches include: U. S. Publ. No. 2014/073144; U. S. Publ. No. 2013/230987; U.S. Pat. No. 7,521,378, U.S. Pat. Nos. 7,557,420, and 8,575,040; and U.S. Pat. No. 7,825,040.

The reference article "Novel Flowable CVD Process Technology for sub-20 nm Interlayer Dielectric", H. Kim et al., Interconnect Technology Conference (IITC), 2012 IEEE International, San Jose, Calif. describes a flowable CVD process using remote plasma during low temperature deposition and ozone treatment to stabilize the film. Also described in the reference was a flowable CVD process which does not oxidize Si or electrode, resulted in removal of $Si_3N_4$ stopper layer as an oxidation or diffusion barrier. After the application of Flowable CVD to 20 nm DRAM ILD, the authors could reduce not only loading capacitance of Bit-line by 15% but also enhance comparable productivity. Through the successful development of sub-20 nm DRAM ILD Gap-fill process, Flowable CVD was successful demonstrated as a promising candidate for mass production-worthy ILD in sub-20 nm next generation devices.

Despite the recent activity in the art related to flowable chemical vapor deposition and other film deposition processes, problems still remain. One of these problems is related to film composition. For example, flowable oxide films deposited from the precursor trisilylamine (TSA) in a gas phase polymerization process yield films with a high density of Si—H bonds and have a wet etch rates in dilute HF solutions that are 2.2 to 2.5 times faster than high quality thermal oxide. Thus, there is a need to provide alternative precursor compounds to produce silicon-containing films with a lower Si—H bond density, a lower film etch rates, or a combination thereof.

BRIEF SUMMARY OF THE INVENTION

The compositions or formulations described herein and methods using same overcome the problems of the prior art by depositing a silicon-containing film on at least a portion of the substrate surface that provides desirable film properties upon post-deposition treatment with an oxygen-containing source. In certain embodiments, the substrate comprises a surface feature. The term "surface feature", as used herein, means that the substrate comprises one or more of the following pores, trenches, shallow trench isolation (STI), vias, reentrant feature, or the like. The compositions can be pre-mixed compositions, pre-mixtures (mixed before being used in the deposition process), or in-situ mixtures (mixed during the deposition process). Thus, in this disclosure the terms "mixture"; "formulation", and "composition" are interchangeable.

In one aspect, the present invention provides a composition for depositing a silicon-containing film on at least a surface of a substrate comprising a surface feature using flowable chemical vapor deposition, the composition comprising at least one silicon-containing compound selected from the group consisting of:

(a) a siloxane compound selected from the group consisting of:

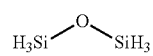

IA

-continued

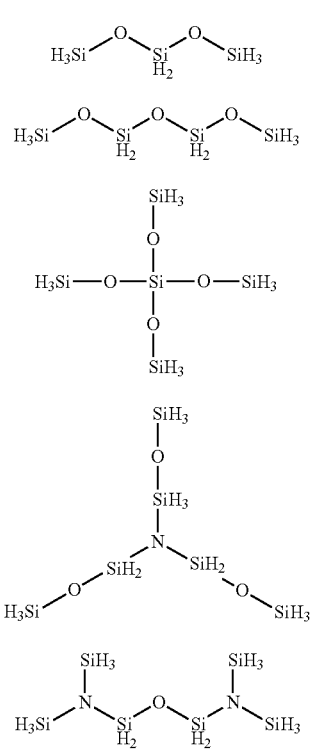

IB
IC
ID
IE
IF (b) a trisilylamine-based compound selected from the group consisting of:

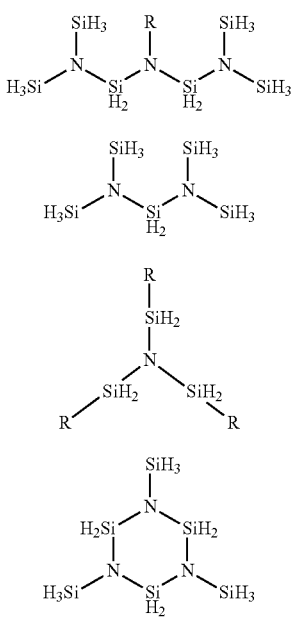

IIA
IIB
IIC
IID wherein substituent R is each independently selected from a hydrogen atom; a halide atom; a linear $C_1$ to $C_{10}$ alkyl group; a branched $C_3$ to $C_{10}$ alkyl group; a linear or branched $C_3$ to $C_{12}$ alkenyl group; a linear or branched $C_3$ to $C_{12}$ alkynyl group; a $C_4$ to $C_{10}$ cyclic alkyl group; and a $C_6$ to $C_{10}$ aryl group;

(c) an organoaminodisilane compound having the following Formula III:

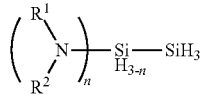

III wherein substituents $R^1$ and $R^2$ are each independently selected from a hydrogen atom; a halide atom; a linear $C_1$ to $C_{10}$ alkyl group; a branched $C_3$ to $C_{10}$ alkyl group; a linear or branched $C_3$ to $C_{12}$ alkenyl group; a linear or branched $C_3$ to $C_{12}$ alkynyl group; a $C_4$ to $C_{10}$ cyclic alkyl group; and a $C_6$ to $C_{10}$ aryl group; wherein optionally $R^1$ and $R^2$ can be linked together to form a ring selected from a substituted or unsubstituted aromatic ring or a substituted or unsubstituted aliphatic ring; and n=1 or 2; and (d) a cyclosilazane compound having the following Formula IV:

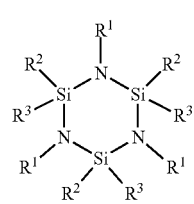

IV wherein substituents $R^1$, $R^2$, and $R^3$ are each independently selected from a hydrogen atom; a halide atom; a linear $C_1$ to $C_{10}$ alkyl group; a branched $C_3$ to $C_{10}$ alkyl group; a linear or branched $C_3$ to $C_{12}$ alkenyl group; a linear or branched $C_3$ to $C_{12}$ alkynyl group; a $C_4$ to $C_{10}$ cyclic alkyl group; and a $C_6$ to $C_{10}$ aryl group; wherein optionally any one or more of $R^1$, $R^2$, and $R^3$ can be linked together to form a ring selected from a substituted or unsubstituted aromatic ring or a substituted or unsubstituted aliphatic ring. In one particular embodiment, the composition comprises the siloxane compound. In another particular embodiment, the composition comprises the trisilylamine-based compound. In a further embodiment, the composition comprises the organoaminodisilane. In a still further embodiment, the composition comprises a cyclosilazane compound.

DETAILED DESCRIPTION OF THE INVENTION

Figure 1A:
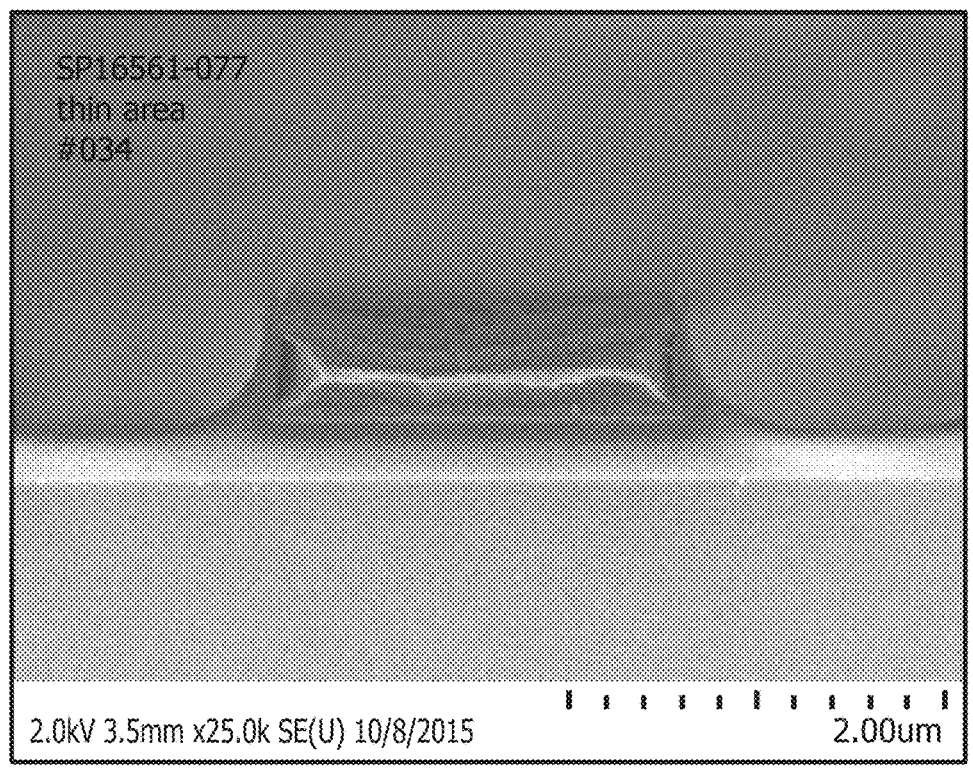
FIG. 1 provides a cross-sectional, scanning electron microscopy (SEM) image on the film deposited in Example 1 using the method and composition described herein and its impact on certain surface features of the substrate.

Described herein are precursors and methods using same to deposit a flowable oxide film via a chemical vapor deposition (CVD) process on at least a portion of the substrate comprising one or more surface features. Certain prior art processes use the precursor trisilylamine (TSA), which is delivered into the reaction chamber as a gas, mixed with ammonia, and activated in a remote plasma reactor to generate $NH_2$, NH, H and or N radicals or ions. The TSA reacts with the plasma activated ammonia and begins to oligomerize to form higher molecular weight TSA dimers and trimers or other species which contain Si, N and H. The substrate is placed in the reactor and cooled to one or more temperatures ranging from about 0 to about 50° C. at a certain chamber pressures and TSA/activated ammonia mixtures the oligomers begin to condense on the wafers surface in such a way that they can "flow" to fill the trench surface feature. In this way, a material which contains Si, N and H is deposited onto the wafer and fills the trench. In certain embodiments, a pre-anneal step is performed to allow the film to be more SiN-like. It is desirable to have a SiN material because the next process step is oxidation at one or more temperatures ranging from 100-700° C. using ozone or water. Because of the SiN bond distance and angles, it is known that as SiN is oxidized to $SiO_2$ there is a unit cell volume increase which prevents the film from shrinking. Film shrinkage is undesirable since it induces tensile stress which increases the films' wet etch rate in dilute HF solutions. It is also desirable to minimize the Si—H content as it is generally difficult to fully oxidize the dense films utilizing ozone and the residual Si—H content also causes increases in wet etch rates. Thus, there is a need in the art to provide a method and composition that minimizes film shrinking, lowers tensile stress, minimizes the Si—H content, and/or does not adversely affect the film's wet etch rate.

The method and composition described herein accomplishes one or more of the following objectives. In certain embodiments, the method and composition described herein avoid using precursor compounds that have Si—C bonds because these bonds are difficult to remove in the introducing step which forms the silicon nitride film, may cause film shrinkage in the oxidation step, and/or cause defects in oxidized films. In this or other embodiments, the method and composition described herein further reduces the SiH content of the film by increasing the ratio of hetero atom to silicon, by introducing ring structures increasing the ratio of silicon to hydrogen in the precursor. In addition, the method and composition described herein helps to control the oligomerization process (e.g., the introducing step of the method wherein the silicon nitride film is formed) by using a precursor compound that has a boiling point higher than TSA which might be condensed onto the wafer surface as a monomer and then polymerized on the surface using for example a nitrogen-based plasma, such as an ammonia $NH_3$ or a plasma comprising hydrogen and nitrogen, and then treating with an oxygen-containing source such as ozone, oxygen or water to form the oxide. In certain embodiments of the method, a pulsed process can be used to slowly grow the silicon nitride film thickness by alternating condensation and plasma polymerization. In these embodiments, the pulsed process grows a thinner film (e.g., 10 nanometers (nm) or less) that may produce a denser silicon oxide film upon exposure to the oxygen source in the treating step.

In certain embodiments, there is provided a composition for depositing a silicon-containing film on at least a surface of a substrate comprising a surface feature using flowable chemical vapor deposition, the composition comprising at least one silicon-containing compound selected from the group consisting of:
(a) a siloxane compound selected from the group consisting of:

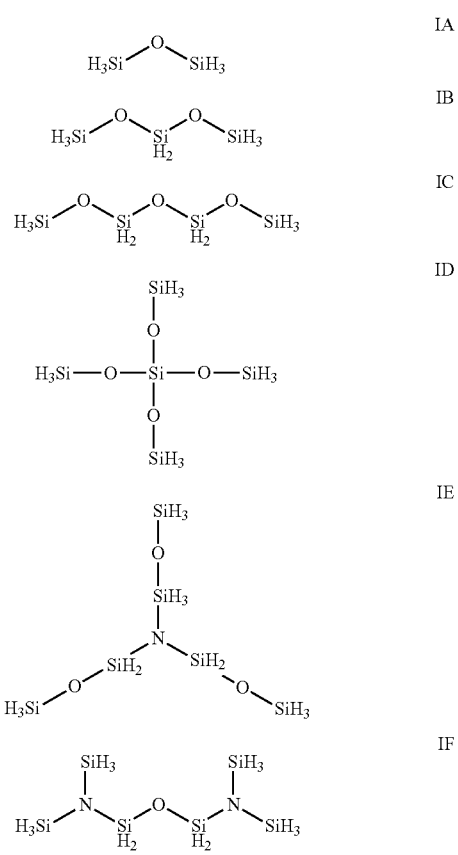

(b) a trisilylamine-based compound selected from the group consisting of:

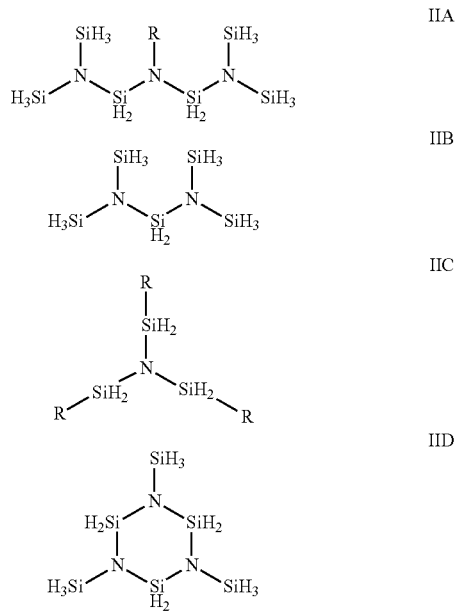

wherein substituent R is each independently selected from a hydrogen atom; a halide atom; a linear $C_1$ to $C_{10}$ alkyl group; a branched $C_3$ to $C_{10}$ alkyl group; a linear or branched $C_3$ to $C_{12}$ alkenyl group; a linear or branched $C_3$ to $C_{12}$ alkynyl group; a $C_4$ to $C_{10}$ cyclic alkyl group; and a $C_6$ to $C_{10}$ aryl group;

(c) an organoaminodisilane compound having the following Formula III:

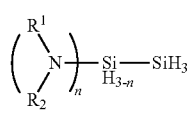

wherein substituents $R^1$ and $R^2$ are each independently selected from a hydrogen atom; a halide atom; a linear $C_1$ to $C_{10}$ alkyl group; a branched $C_3$ to $C_{10}$ alkyl group; a linear or branched $C_3$ to $C_{12}$ alkenyl group; a linear or branched $C_3$ to $C_{12}$ alkynyl group; a $C_4$ to $C_{10}$ cyclic alkyl group; and a $C_6$ to $C_{10}$ aryl group; wherein optionally $R^1$ and $R^2$ can be linked together to form a ring selected from a substituted or unsubstituted aromatic ring or a substituted or unsubstituted aliphatic ring; and n=1 or 2; and (d) a cyclosilazane compound having the following Formula IV:

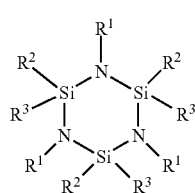

wherein substituents $R^1$, $R^2$, and $R^3$ are each independently selected from a hydrogen atom; a halide atom; a linear $C_1$ to $C_{10}$ alkyl group; a branched $C_3$ to $C_{10}$ alkyl group; a linear or branched $C_3$ to $C_{12}$ alkenyl group; a linear or branched $C_3$ to $C_{12}$ alkynyl group; a $C_4$ to $C_{10}$ cyclic alkyl group; and a $C_6$ to $C_{10}$ aryl group; wherein optionally any one or more of $R^1$, $R^2$, and $R^3$ can be linked together to form a ring selected from a substituted or unsubstituted aromatic ring or a substituted or unsubstituted aliphatic ring.

In embodiments wherein the precursor compound comprises a siloxane precursor, examples of siloxane precursors include, but are not limited to, di and trisiloxanes and combinations thereof such as those provided in Formula IA-ID. Further embodiments combine siloxane features with silazane features such as, for example, as in Formula IE and IF. Not being bound by theory, it is believed that the siloxane precursor described herein react to form oxynitride like films and propagate in two dimensions providing better flowability and ease of oxidation to remove Si—H bonds. Further, in these embodiments, absence of carbon will help to reduce film shrinkage during film curing.

In other embodiments, the precursor compound comprises a trisilylamine (TSA)-based compound such as those compounds shown in Formulae IIA-IID. One example of this compound comprises bis(disilylamino)silane (IIB). Another example of this embodiment is the Formula IIC compound tris(ethylsilyl)amine wherein ethylene acts as leaving group in a flowable chemical vapor deposition (FCVD) process creating additional Si reactive sites while at the same time lowering the Si—H content in the precursor. While not being bound by theory, in these embodiments, it is believed that the higher order oligomers (2x-4x) of TSA formed through the elimination of silane in the introducing step in the presence of a nitrogen source reduces the ratio of H to Si in the precursor and subsequent film which will then reduce the Si—H bond density in the deposited and cured film.

In alternative embodiments, the precursor compound comprises an organoaminodisilane compound such as those compounds shown in Formula III. An example of such compounds is di-secbutylaminodisilane. While not being bound by theory, these precursor can be directly converted to an oxide as the insertion of oxygen in the Si—Si bond can increase the volume of the film to offset volume loss during film curing. This differs from the use of TSA which is used to generate a Si—N—H film network not containing a Si—Si bond that is expanded upon exposure to an oxygen source such as ozone.

In a still further embodiment, the precursor compound comprises a substituted cyclictrisilazane precursor(s), as in formula IV examples of these precursor(s) include compounds that have one of the following structures: 1,3,5-trimethyl-1,3,5-triaza-2,4,6-trisila-cyclohexane. In these embodiments, it is believed that the ring structure will lower the SiH content in the film which is advantageous in order to form a higher density oxide film.

The silicon precursor compounds described herein may be delivered to the reaction chamber such as a CVD or ALD reactor in a variety of ways. In one embodiment, a liquid delivery system may be utilized. In an alternative embodiment, a combined liquid delivery and flash vaporization process unit may be employed, such as, for example, the turbo vaporizer manufactured by MSP Corporation of Shoreview, Minn., to enable low volatility materials to be volumetrically delivered, which leads to reproducible transport and deposition without thermal decomposition of the precursor. In liquid delivery formulations, the precursors described herein may be delivered in neat liquid form, or alternatively, may be employed in solvent formulations or compositions comprising same. Thus, in certain embodiments the precursor formulations may include solvent component(s) of suitable character as may be desirable and advantageous in a given end use application to form a film on a substrate.

The silicon precursor compounds are preferably substantially free of halide ions such as chloride or metal ions such as Al. As used herein, the term "substantially free" as it relates to halide ions (or halides) such as, for example, chlorides and fluorides, bromides, iodides, $Al^{3+}$ ions, $Fe^{2+}$, $Fe^{3+}$, $Ni^{2+}$, $Cr^{3+}$ means less than 5 ppm (by weight), preferably less than 3 ppm, and more preferably less than 1 ppm, and most preferably 0 ppm. Chlorides or metal ions are known to act as decomposition catalysts for silicon precursors. Significant levels of chloride in the final product can cause the silicon precursors to degrade. The gradual degradation of the silicon precursors may directly impact the film deposition process making it difficult for the semiconductor manufacturer to meet film specifications. In addition, the shelf-life or stability is negatively impacted by the higher degradation rate of the silicon precursors thereby making it difficult to guarantee a 1-2 year shelf-life. Moreover, silicon precursors are known to form flammable and/or pyrophoric gases upon decomposition such as hydrogen and silane. Therefore, the accelerated decomposition of the silicon precursors presents safety and performance concerns related to the formation of these flammable and/or pyrophoric gaseous byproducts.

Compositions according to the present invention that are substantially free of halides can be achieved by (1) reducing or eliminating chloride sources during chemical synthesis, and/or (2) implementing an effective purification process to remove chloride from the crude product such that the final purified product is substantially free of chlorides. Chloride sources may be reduced during synthesis by using reagents that do not contain halides such as chlorodisilanes, bromodisilanes, or iododisilanes thereby avoiding the production of by-products that contain halide ions. In addition, the aforementioned reagents should be substantially free of chloride impurities such that the resulting crude product is substantially free of chloride impurities. In a similar manner, the synthesis should not use halide based solvents, catalysts, or solvents which contain unacceptably high levels of halide contamination. The crude product may also be treated by various purification methods to render the final product substantially free of halides such as chlorides. Such methods are well described in the prior art and, may include, but are not limited to purification processes such as distillation, or adsorption. Distillation is commonly used to separate impurities from the desire product by exploiting differences in boiling point. Adsorption may also be used to take advantage of the differential adsorptive properties of the components to effect separation such that the final product is substantially free of halide. Adsorbents such as, for example, commercially available $MgO$—$Al_2O_3$ blends can be used to remove halides such as chloride.

For those embodiments relating to a composition comprising a solvent(s) and at least one compound described herein, the solvent or mixture thereof selected does not react with the silicon compound. The amount of solvent by weight percentage in the composition ranges from 0.5% by weight to 99.5% or from 10% by weight to 75%. In this or other embodiments, the solvent has a boiling point (b.p.) similar to the b.p. of the silicon precursor precursors of Formula I, II, III, and IV or the difference between the b.p. of the solvent and the b.p. of the silicon precursor precursors of Formula II is 40° C. or less, 30° C. or less, or 20° C. or less, 10° C. or less, or 5° C. or less. Alternatively, the difference between the boiling points ranges from any one or more of the following end-points: 0, 10, 20, 30, or 40° C. Examples of suitable ranges of b.p. difference include without limitation, 0 to 40° C., 20° to 30° C., or 10° to 30° C. Examples of suitable solvents in the compositions include, but are not limited to, an ether (such as 1,4-dioxane, dibutyl ether), a tertiary amine (such as pyridine, 1-methylpiperidine, 1-ethylpiperidine, N,N'-Dimethylpiperazine, N,N,N',N'-Tetramethylethylenediamine), a nitrile (such as benzonitrile), an alkyl hydrocarbon (such as octane, nonane, dodecane, ethylcyclohexane), an aromatic hydrocarbon (such as toluene, mesitylene), a tertiary aminoether (such as bis(2-dimethylaminoethyl) ether), or mixtures thereof. Some non-limiting exemplary compositions include, but are not limited to, a composition comprising bis(disilylamino)silane (b.p. about 135° C.) and octane (b.p. 125 to 126° C.); a composition comprising bis(disilylamino)silane (b.p. about 135° C.) and ethylcyclohexane (b.p. 130-132° C.); a composition comprising bis(disilylamino)silane (b.p. about 135° C.) and toluene (b.p. 115° C.); a composition comprising bis(disilylamino)silane (b.p. about 135° C.) and cyclooctane (b.p. 149° C.).

In the formulae above and throughout the description, the term "linear alkyl" denotes a linear functional group having from 1 to 10, 3 to 10, or 1 to 6 carbon atoms. In the formulae above and throughout the description, the term "branched alkyl" denotes a linear functional group having from 3 to 10, or 1 to 6 carbon atoms. Exemplary linear alkyl groups include, but are not limited to, methyl, ethyl, propyl, butyl, pentyl, and hexyl groups. Exemplary branched alkyl groups include, but are not limited to, isopropyl, isobutyl, sec-butyl, tert-butyl, iso-pentyl, tert-pentyl, isohexyl, and neohexyl. In certain embodiments, the alkyl group may have one or more functional groups such as, but not limited to, an alkoxy group, a dialkylamino group or combinations thereof, attached thereto. In other embodiments, the alkyl group does not have one or more functional groups attached thereto. The alkyl group may be saturated or, alternatively, unsaturated.

In the formulae above and through the description, the term "halide" denotes a chloride, bromide, iodide, or fluoride ion.

In the formulae above and throughout the description, the term "cyclic alkyl" denotes a cyclic group having from 3 to 10 or 5 to 10 atoms. Exemplary cyclic alkyl groups include, but are not limited to, cyclobutyl, cyclopentyl, cyclohexyl, and cyclooctyl groups. In certain embodiments, the cyclic alkyl group may have one or more $C_1$ to $C_{10}$ linear, branched substituents, or substituents containing oxygen or nitrogen atoms. In this or other embodiments, the cyclic alkyl group may have one or more linear or branched alkyls or alkoxy groups as substituents, such as, for example, a methylcyclohexyl group or a methoxycyclohexyl group.

In the formulae above and throughout the description, the term "aryl" denotes an aromatic cyclic functional group having from 3 to 10 carbon atoms, from 5 to 10 carbon atoms, or from 6 to 10 carbon atoms. Exemplary aryl groups include, but are not limited to, phenyl, benzyl, chlorobenzyl, tolyl, and o-xylyl.

In the formulae above and throughout the description, the term "alkenyl group" denotes a group which has one or more carbon-carbon double bonds and has from 2 to 12, from 2 to 10, or from 2 to 6 carbon atoms. Exemplary alkenyl groups include, but are not limited to, vinyl or allyl groups.

The term "alkynyl group" denotes a group which has one or more carbon-carbon triple bonds and has from 2 to 12 or from 2 to 6 carbon atoms.

In the formulae above and through the description, the term "unsaturated" as used herein means that the functional group, substituent, ring or bridge has one or more carbon double or triple bonds. An example of an unsaturated ring can be, without limitation, an aromatic ring such as a phenyl ring. The term "saturated" means that the functional group, substituent, ring or bridge does not have one or more double or triple bonds.

In certain embodiments, one or more of the alkyl group, alkenyl group, alkynyl group, aryl group, and/or aromatic group in the formulae may be "substituted" or have one or more atoms or group of atoms substituted in place of, for example, a hydrogen atom. Exemplary substituents include, but are not limited to, oxygen, sulfur, halogen atoms (e.g., F, Cl, I, or Br), nitrogen, alkyl groups, and phosphorous. In other embodiments, one or more of the alkyl group, alkenyl group, alkynyl group, aromatic and/or aryl group in the formulae may be unsubstituted.

In certain embodiments, any one or more of substituents $R^1$, $R^2$ and $R^3$ in the formulae described above can be linked with a C—C bond in the above formula to form a ring structure when they are not hydrogen. As the skilled person will understand, the substituent may be selected from a linear or branched $C_1$ to $C_{10}$ alkylene moiety; a $C_2$ to $C_{12}$ alkenylene moiety; a $C_2$ to $C_{12}$ alkynylene moiety; a $C_4$ to $C_{10}$ cyclic alkyl moiety; and a $C_6$ to $C_{10}$ arylene moiety. In these embodiments, the ring structure can be unsaturated such as, for example, a cyclic alkyl ring, or saturated, for example, an aryl ring. Further, in these embodiments, the ring structure can also be substituted or substituted. In other embodiments, any one or more of substituents $R^1$, $R^2$ and $R^3$ are not linked.

The method used to form the films or coatings described herein are deposition processes. Examples of suitable deposition processes for the method disclosed herein include, but are not limited to, chemical vapor deposition (CVD) or plasma enhanced cyclic CVD (PECCVD) process. As used herein, the term "chemical vapor deposition processes" refers to any process wherein a substrate is exposed to one or more volatile precursors, which react and/or decompose on the substrate surface to produce the film or material. Although the precursors, reagents and sources used herein may be sometimes described as "gaseous", it is understood that the precursors can be either liquid or solid which are transported with or without an inert gas into the reactor via direct vaporization, bubbling or sublimation. In some case, the vaporized precursors can pass through a plasma generator. In one embodiment, the films are deposited using a plasma-based (e.g., remote generated or in situ) CVD process. In another embodiment, the films are deposited using a CCVD process. In a further embodiment, the films are deposited using a thermal CVD process. The term "reactor" as used herein, includes without limitation, a reaction chamber or deposition chamber.

In certain embodiments, the substrate may be exposed to one or more pre-deposition treatments such as, but not limited to, a plasma treatment, thermal treatment, chemical treatment, ultraviolet light exposure, electron beam exposure, and combinations thereof to affect one or more properties of the films. These pre-deposition treatments may occur under an atmosphere selected from inert, oxidizing, and/or reducing.

Energy is applied to the at least one of the compound, nitrogen-containing source, oxygen source, other precursors or combination thereof to induce reaction and to form the silicon-containing film or coating on the substrate. Such energy can be provided by, but not limited to, thermal, plasma, pulsed plasma, helicon plasma, high density plasma, inductively coupled plasma, X-ray, e-beam, photon, remote plasma methods, and combinations thereof. In certain embodiments, a secondary RF frequency source can be used to modify the plasma characteristics at the substrate surface. In embodiments wherein the deposition involves plasma, the plasma-generated process may comprise a direct plasma-generated process in which plasma is directly generated in the reactor, or alternatively a remote plasma-generated process in which plasma is generated outside of the reactor and supplied into the reactor.

As previously mentioned, the method deposits a film upon at least a portion of the surface of a substrate comprising a surface feature. The substrate is placed into the reactor and the substrate is maintained at one or more temperatures ranging from about −20° C. to about 400° C. In one particular embodiment, the temperature of the substrate is less than the walls of the chamber. The substrate temperature is held at a temperature below 100° C., preferably at a temperature below 25° C. and most preferably below 10° C. and greater than −20° C.

As previously mentioned, the substrate comprises one or more surface features. In one particular embodiment, the surface feature(s) have a width of 100 μm or less, 1 μm in width or less, or 0.5 μm in width. In this or other embodiments, the aspect ratio (the depth to width ratio) of the surface features, if present, is 0.1:1 or greater, or 1:1 or greater, or 10:1 or greater, or 20:1 or greater, or 40:1 or greater. The substrate may be a single crystal silicon wafer, a wafer of silicon carbide, a wafer of aluminum oxide (sapphire), a sheet of glass, a metallic foil, an organic polymer film or may be a polymeric, glass, silicon or metallic 3-dimensional article. The substrate may be coated with a variety of materials well known in the art including films of silicon oxide, silicon nitride, amorphous carbon, silicon oxycarbide, silicon oxynitride, silicon carbide, gallium arsenide, gallium nitride and the like. These coatings may completely coat the substrate, may be in multiple layers of various materials and may be partially etched to expose underlying layers of material. The surface may also have on it a photoresist material that has been exposed with a pattern and developed to partially coat the substrate.

In certain embodiments, the reactor is at a pressure below atmospheric pressure or 750 torr ($10^5$ Pascals (Pa)) or less, or 100 torr (13332 Pa) or less. In other embodiments, the pressure of the reactor is maintained at a range of about 0.1 torr (13 Pa) to about 10 torr (1333 Pa).

In one particular embodiment, the introducing step, wherein the at least one compound and nitrogen source is introduced into the reactor, is conducted at one or more temperatures ranging from 0 to 1000° C., or from about 400° C. to about 1000° C., or from about 400° C. to about 600° C., 450° C. to about 600° C., or from about 450° C. to about 550° C. In these or other embodiments, the substrate comprises a semiconductor substrate comprising a surface feature. The nitrogen-containing source can be selected from the group consisting of ammonia, hydrazine, monoalkylhydrazine, dialkylhydrazine, nitrogen, nitrogen plasma, nitrogen/hydrogen plasma, nitrogen/helium plasma, nitrogen/argon plasma, ammonia plasma, ammonia/helium plasma, ammonia/argon plasma, ammonia/nitrogen plasma, $NF_3$, $NF_3$ plasma, organic amine plasma, and mixtures thereof. The at least one compound and nitrogen source react and form a silicon nitride film (which is non-stoichiometric) on at least a portion of the surface feature and substrate.

After the silicon nitride film is deposited, the substrate is optionally treated with an oxygen-containing source under certain process conditions sufficient to make the silicon nitride film form a silicon oxide or a silicon oxynitride film. The oxygen-containing source can be selected from the group consisting of water ($H_2O$), oxygen ($O_2$), oxygen plasma, ozone ($O_3$), NO, $N_2O$, carbon monoxide (CO), carbon dioxide ($CO_2$), $N_2O$ plasma, carbon monoxide (CO) plasma, carbon dioxide ($CO_2$) plasma, and combinations thereof.

In one particular embodiment, the method for depositing a silicon oxide or a carbon-doped silicon oxide film in a flowable chemical vapor deposition process comprises:

placing a substrate having a surface feature into a reactor which are maintained at a temperature ranging from −20° C. to about 400° C.;

introducing into the reactor at least one compound selected from the group consisting of:

(a) a siloxane compound selected from the group consisting of:

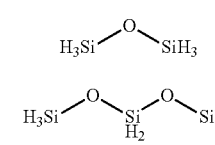

IA

IB

-continued

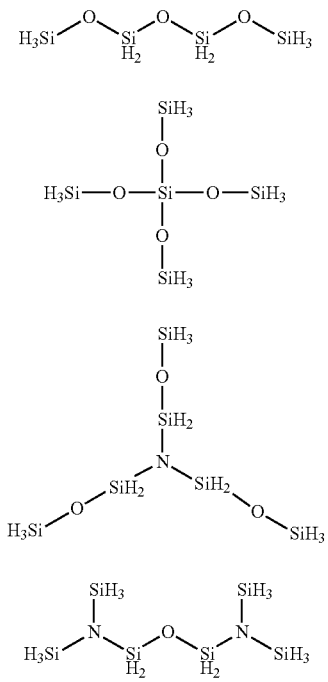

(b) a trisilylamine-based compound selected from the group consisting of:

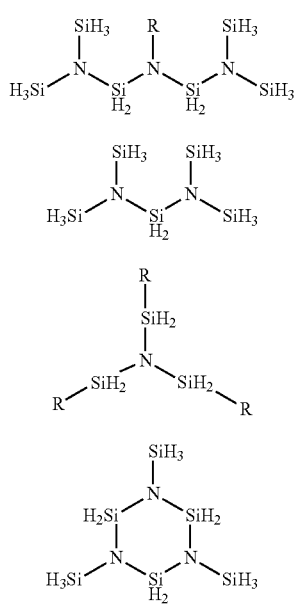

wherein substituent R is each independently selected from a hydrogen atom; a halide atom; a linear $C_1$ to $C_{10}$ alkyl group; a branched $C_3$ to $C_{10}$ alkyl group; a linear or branched $C_3$ to $C_{12}$ alkenyl group; a linear or branched $C_3$ to $C_{12}$ alkynyl group; a $C_4$ to $C_{10}$ cyclic alkyl group; and a $C_6$ to $C_{10}$ aryl group;

(c) an organoaminodisilane compound having the following Formula III:

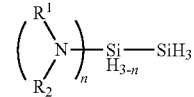

wherein substituents W and $R^2$ are each independently selected from a hydrogen atom; a halide atom; a linear $C_1$ to $C_{10}$ alkyl group; a branched $C_3$ to $C_{10}$ alkyl group; a linear or branched $C_3$ to $C_{12}$ alkenyl group; a linear or branched $C_3$ to $C_{12}$ alkynyl group; a $C_4$ to $C_{10}$ cyclic alkyl group; and a $C_6$ to $C_{10}$ aryl group; wherein optionally $R^1$ and $R^2$ can be linked together to form a ring selected from a substituted or unsubstituted aromatic ring or a substituted or unsubstituted aliphatic ring; and n=1 or 2; and (d) a cyclosilazane compound having the following Formula IV:

wherein substituents $R^1$, $R^2$, and $R^3$ are each independently selected from a hydrogen atom; a halide atom; a linear $C_1$ to $C_{10}$ alkyl group; a branched $C_3$ to $C_{10}$ alkyl group; a linear or branched $C_3$ to $C_{12}$ alkenyl group; a linear or branched $C_3$ to $C_{12}$ alkynyl group; a $C_4$ to $C_{10}$ cyclic alkyl group; and a $C_6$ to $C_{10}$ aryl group; wherein optionally any one or more of $R^1$, $R^2$, and $R^3$ can be linked together to form a ring selected from a substituted or unsubstituted aromatic ring or a substituted or unsubstituted aliphatic ring, wherein optionally any one or more of $R^1$, $R^2$, and $R^3$ can be linked together to form a ring selected from a substituted or unsubstituted aromatic ring or a substituted or unsubstituted aliphatic ring and a nitrogen source wherein the at least one compound reacts with the nitrogen source to form a nitride containing film on at least a portion of the surface feature; and treating the substrate with an oxygen source at one or more temperatures ranging from about 100° C. to about 1000° C. to form the silicon oxide film on at least a portion of the surface feature to provide the silicon oxide film. Alternatively, the film may be exposed to an oxygen source while being exposed to UV irradiation at temperatures ranging from about 100° C. to about 1000° C. The process steps can be repeated until the surface features are filled with the high quality silicon oxide film.

In a further embodiment of the method described herein, the film is deposited using a flowable CVD process. In this embodiment, the method comprises:

placing one or more substrates comprising a surface feature into a reactor which is heated to a temperature ranging from −20° C. to about 400° C. and maintained at a pressure of 100 torr or less;

introducing at least one compound selected from the group consisting of:

(a) a siloxane compound selected from the group consisting of:

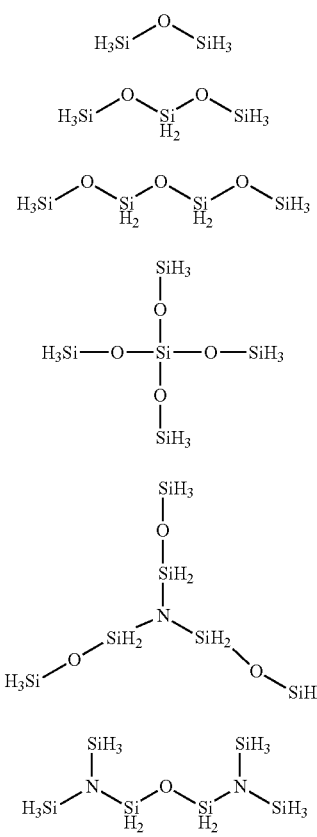

(b) a trisilylamine-based compound selected from the group consisting of:

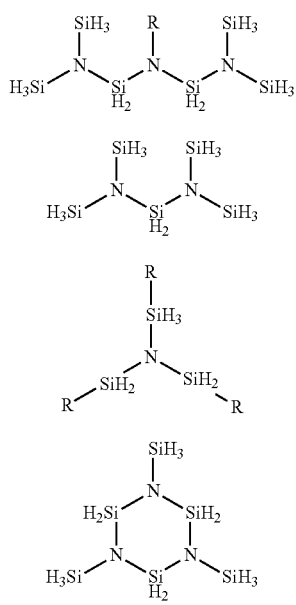

wherein substituent R is each independently selected from a hydrogen atom; a halide atom; a linear $C_1$ to $C_{10}$ alkyl group; a branched $C_3$ to $C_{10}$ alkyl group; a linear or branched $C_3$ to $C_{12}$ alkenyl group; a linear or branched $C_3$ to $C_{12}$ alkynyl group; a $C_4$ to $C_{10}$ cyclic alkyl group; and a $C_6$ to $C_{10}$ aryl group;

(c) an organoaminodisilane compound having the following Formula III:

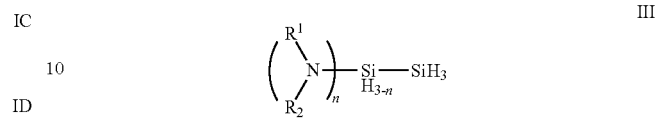

wherein substituents $R^1$ and $R^2$ are each independently selected from a hydrogen atom; a halide atom; a linear $C_1$ to $C_{10}$ alkyl group; a branched $C_3$ to $C_{10}$ alkyl group; a linear or branched $C_3$ to $C_{12}$ alkenyl group; a linear or branched $C_3$ to $C_{12}$ alkynyl group; a $C_4$ to $C_{10}$ cyclic alkyl group; and a $C_6$ to $C_{10}$ aryl group; wherein optionally $R^1$ and $R^2$ can be linked together to form a ring selected from a substituted or unsubstituted aromatic ring or a substituted or unsubstituted aliphatic ring; and n=1 or 2; and (d) a cyclosilazane compound having the following Formula IV:

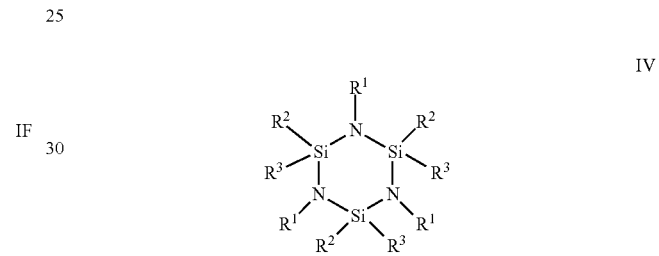

wherein substituents $R^1$, $R^2$, and $R^3$ are each independently selected from a hydrogen atom; a halide atom; a linear $C_1$ to $C_{10}$ alkyl group; a branched $C_3$ to $C_{10}$ alkyl group; a linear or branched $C_3$ to $C_{12}$ alkenyl group; a linear or branched $C_3$ to $C_{12}$ alkynyl group; a $C_4$ to $C_{10}$ cyclic alkyl group; and a $C_6$ to $C_{10}$ aryl group; wherein optionally any one or more of $R^1$, $R^2$, and $R^3$ can be linked together to form a ring selected from a substituted or unsubstituted aromatic ring or a substituted or unsubstituted aliphatic ring, wherein optionally any one or more of $R^1$, $R^2$, and $R^3$ can be linked together to form a ring selected from a substituted or unsubstituted aromatic ring or a substituted or unsubstituted aliphatic ring;

providing an oxygen source into the reactor to react with the at least one compound to form a film and cover at least a portion of the surface feature;

annealing the film at one or more temperatures of about 100° C. to 1000° C., preferably 100° to 400° C. to allow the silicon-containing films to coat at least a portion of the surface feature. The oxygen source of this embodiment is selected from the group consisting of water vapors, water plasma, ozone, oxygen, oxygen plasma, oxygen/helium plasma, oxygen/argon plasma, nitrogen oxides plasma, carbon dioxide plasma, hydrogen peroxide, organic peroxides, and mixtures thereof. The process can be repeated until the surface features are filled with the silicon-containing film. When water vapors are employed as oxygen source in this embodiment, the substrate temperatures are preferably between −20 and 40° C., most preferably between −10 and 25° C.

In yet a further embodiment of the method described herein, a silicon-containing film selected from the group consisting of a silicon nitride, a carbon-doped silicon nitride, a silicon oxynitride, and a carbon-doped silicon oxynitride film, is deposited using a flowable plasma enhanced CVD process. In this embodiment, the method comprises:

placing one or more comprising a surface feature into a reactor which is heated to a temperature ranging from −20° C. to about 400° C. and maintained at a pressure of 100 torr or less;

introducing at least one compound selected from the group consisting of:

(a) a siloxane compound selected from the group consisting of:

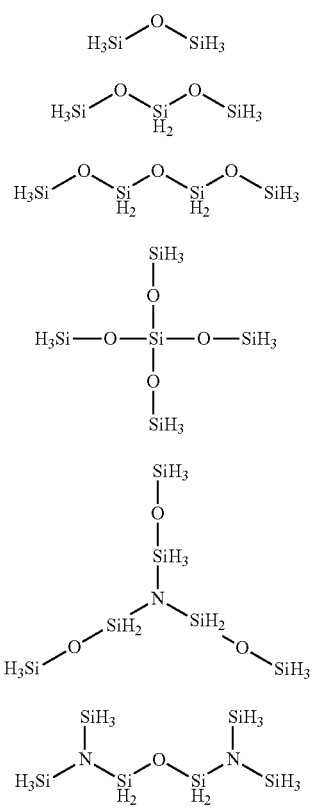

(b) a trisilylamine-based compounds selected from the group consisting of:

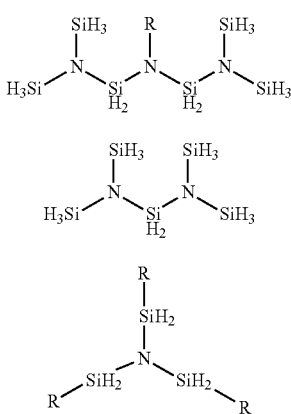

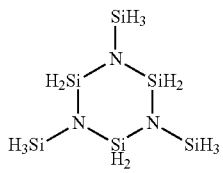

wherein substituent R is each independently selected from a hydrogen atom; a halide atom; a linear $C_1$ to $C_{10}$ alkyl group; a branched $C_3$ to $C_{10}$ alkyl group; a linear or branched $C_3$ to $C_{12}$ alkenyl group; a linear or branched $C_3$ to $C_{12}$ alkynyl group; a $C_4$ to $C_{10}$ cyclic alkyl group; and a $C_6$ to $C_{10}$ aryl group;

(c) an organoaminodisilane compound having the following Formula III:

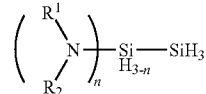

wherein substituents $R^1$ and $R^2$ are each independently selected from a hydrogen atom; a halide atom; a linear $C_1$ to $C_{10}$ alkyl group; a branched $C_3$ to $C_{10}$ alkyl group; a linear or branched $C_3$ to $C_{12}$ alkenyl group; a linear or branched $C_3$ to $C_{12}$ alkynyl group; a $C_4$ to $C_{10}$ cyclic alkyl group; and a $C_6$ to $C_{10}$ aryl group; wherein optionally $R^1$ and $R^2$ can be linked together to form a ring selected from a substituted or unsubstituted aromatic ring or a substituted or unsubstituted aliphatic ring; and n=1 or 2;

(d) a cyclosilazane compound having the following Formula IV:

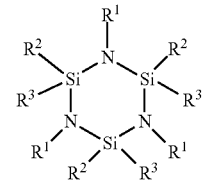

wherein substituents $R^1$, $R^2$, and $R^3$ are each independently selected from a hydrogen atom; a halide atom; a linear $C_1$ to $C_{10}$ alkyl group; a branched $C_3$ to $C_{10}$ alkyl group; a linear or branched $C_3$ to $C_{12}$ alkenyl group; a linear or branched $C_3$ to $C_{12}$ alkynyl group; a $C_4$ to $C_{10}$ cyclic alkyl group; and a $C_6$ to $C_{10}$ aryl group; wherein optionally any one or more of $R^1$, $R^2$, and $R^3$ can be linked together to form a ring selected from a substituted or unsubstituted aromatic ring or a substituted or unsubstituted aliphatic ring, wherein optionally any one or more of $R^1$, $R^2$, and $R^3$ can be linked together to form a ring selected from a substituted or unsubstituted aromatic ring or a substituted or unsubstituted aliphatic ring;

providing a plasma source into the reactor to react with the compound to form a coating on at least a portion of the surface features; and annealing the coating at one or more temperatures ranging from about 100° C. to 1000° C., or from about 100° to 400° C., to form a silicon-containing film on at least a portion of the surface features. The plasma for this embodiment is selected from the group consisting of nitrogen plasma, nitrogen/helium plasma, nitrogen/argon plasma, ammonia plasma, ammonia/helium plasma, ammonia/argon/plasma, helium plasma, argon plasma, hydrogen plasma, hydrogen/helium plasma, nitrogen/hydrogen plasma, hydrogen/argon plasma, organic amine plasma, and mixtures thereof. For flowable plasma enhanced CVD, the process can be repeated several times until the vias or trenches are filled with densified film(s).

The above steps define one cycle for the methods described herein; and the cycle can be repeated until the desired thickness of a silicon-containing film is obtained. In this or other embodiments, it is understood that the steps of the methods described herein may be performed in a variety of orders, may be performed sequentially or concurrently (e.g., during at least a portion of another step), and any combination thereof. The respective step of supplying the compounds and other reagents may be performed by varying the duration of the time for supplying them to change the stoichiometric composition of the resulting silicon-containing film.

In certain embodiments, the resultant silicon-containing films or coatings can be exposed to a post-deposition treatment such as, but not limited to, a plasma treatment, chemical treatment, ultraviolet light exposure, infrared exposure, electron beam exposure, and/or other treatments to affect one or more properties of the film.

Throughout the description, the term "organic amine" as used herein describes an organic compound that has at least one nitrogen atom. Examples of organoamine, but are not limited to, methylamine, ethylamine, propylamine, iso-propylamine, tert-butylamine, sec-butylamine, tert-amylamine, ethylenediamine, dimethylamine, trimethylamine, diethylamine, pyrrole, 2,6-dimethylpiperidine, di-n-propylamine, di-iso-propylamine, ethylmethylamine, N-methylaniline, pyridine, and triethylamine.

Throughout the description, the term "silicon nitride" as used herein refers to a film comprising silicon and nitrogen selected from the group consisting of stoichiometric or non-stoichiometric silicon nitride, silicon carbonitride, silicon carboxynitride, silicon aluminum nitride and there mixture thereof.

Throughout the description, the term "silicon oxide" as used herein refers to a film comprising silicon and oxygen selected from the group consisting of stoichiometric or non-stoichiometric silicon oxide, carbon doped silicon oxide, silicon carboxynitride and there mixture thereof.

The following examples illustrate the composition and method for depositing silicon-containing films described herein and are not intended to limit it in any way.

WORKING EXAMPLES

General Deposition Conditions

The flowable chemical vapor deposited (CVD) films were deposited onto medium resistivity (8-12 Ωcm) single crystal silicon wafer substrates and Al pattern wafers.

The depositions were performed on an Applied Materials Precision 5000 system in a 200 mm DXZ chamber, using either a silane or a TEOS process kit. The plasma enhanced chemical vapor deposition (PECVD) chamber was equipped with direct liquid injection (DLI) delivery capability. The precursors were liquids with delivery temperatures dependent on the precursor's boiling point. To deposit the initial flowable nitride films, typical liquid precursor flow rates ranged from about 100 to about 5000 mg/min, in-situ plasma power density ranged from about 0.25 to about 3.5 $W/cm^2$, and the pressure ranged from about 0.75-12 Torr. To convert the initially deposited, flowable nitride films into oxide films, the films were exposed to an oxygen source comprising ozone at a temperature ranging from about 25° C. to about 300° C. The deposited films were densified by UV treatment and thermal annealing at 800° C. in $N_2$ ambient ($O_2$<10 ppm). To convert the initial flowable nitride films into high quality nitride films, the films were treated by $NH_3$ or $N_2$ plasma from room temperature to 400° C. and UV cure. Thickness and refractive index (RI) at 632 nm were measured by a reflectometer or ellipsometer. The typical film thickness ranged from about 10 to about 2000 nm. Bonding properties hydrogen content (Si—H, C—H and N—H) of the silicon-based films were measured and analyzed by a Nicolet transmission Fourier transform infrared spectroscopy (FTIR) tool. All density measurements were accomplished using X-ray reflectivity (XRR). X-ray Photoelectron Spectroscopy (XPS) and Secondary ion mass spectrometry (SIMS) analysis were performed to determine the elemental composition of the films. Wet etch rate (WER) was measured in 100:1 dilute HF solutions. A mercury probe was adopted for the electrical properties measurement including dielectric constant, leakage current and breakdown field. The flowability and gap fill effects on an Al patterned wafer were observed by a cross-sectional Scanning Electron Microscopy (SEM) using a Hitachi S-4700 system at a resolution of 2.0 nm.

Flowable CVD depositions were conducted using a design of experiment (DOE) methodology. The experimental design includes: precursor flow ranging from about 100 to about 5000 mg/min or from about 1000 to about 2000 mg/min; $NH_3$ flow from about 100 sccm to about 1000 sccm, preferably from about 100 to 300 about sccm; pressure ranging from 0.75 to 12 Torr, preferably from about 8 to 12 Torr; RF power (approximately 13.56 MHz) and ranging from about 100 to 1000 W, or from about 50 to about 200 W; Low-frequency (LF) power ranging from about 0 to 100 W; and deposition temperature ranging from about 150 to about 550° C., or from about 0 to 100° C. The DOE experiments were used to determine what process parameters produced the optimal film with good flowability.

Example 1: Deposition of Silicon Oxide Films Using Bis(disilylamino)silane (or disilyltrisilazane) Formula IIB A number of silicon oxide films were deposited using bis(disilylamino)silane as a precursor onto 8 inch silicon substrates and patterned substrates (e.g. having a surface feature) to compare the relative flowability, film density, and wet etch rate of the films.

Of the initial flowable nitride films deposited by bis (disilylamino)silane, the process conditions used to provide the most favorable film properties were as follows: Bis (disilylamino)silane flow (800-2000 mg/min), $NH_3$ flow (200~500 sccm), He (100~300 sccm), Pressure (8~10 torr), RF (80~120 W), and Temperature (40~50° C.). Table 1 shows the deposition conditions for a selected flowable film deposition using Bis(disilylamino)silane:

TABLE 1

| Power (W) | Spacing (mils) | Pressure (Torr) | TSA dimer (mg/min) | He (sccm) | $NH_3$ (sccm) | Deposition (Dep) Temp (° C.) |
|---|---|---|---|---|---|---|
| 100 | 200 | 8 | 1000 | 100 | 500 | 43 |

Figure 1B:
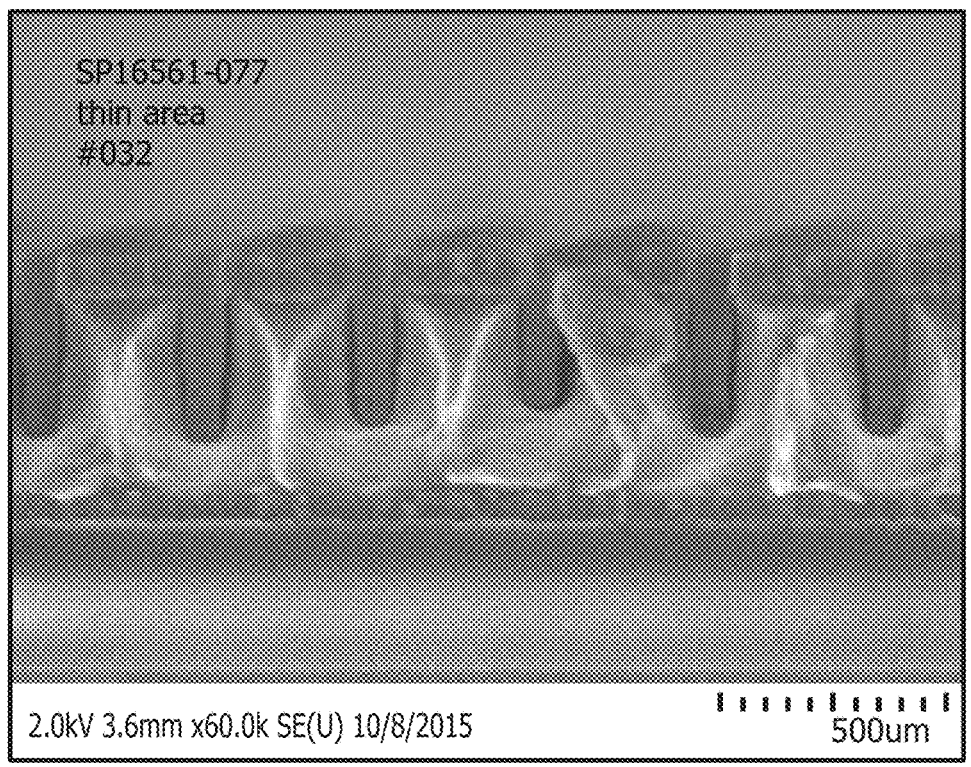

The deposited silicon nitride films were exposed to the oxygen source ozone $O_3$ for oxidation. The flowability and gap-fill effect on pattern wafers are shown in FIG. 1. A visual review of the cross-sectional SEM image on the larger surface feature shows good flowability in the trench means that the features were void free, seamless, bottoms-up fill; the cross-sectional SEM image on the smaller surface feature indicates the good gap-filling effect of the flowable bis(disilylamino)silane film. The deposited films were treated by curing with ultraviolet (UV) for 10~15 min and densified by thermal annealing at one or more temperatures ranging from about 600 to about 800° C. for 1~2 hours. The refractive index of 1.45 and FT-IR spectrum indicate that the oxide films are high quality oxide films. The wet etch rate (WER) of the post-annealed films were tested by dipping the films into 100:1 dilute HF and compared with thermal oxide films. The WER of the silicon oxide film was 4.2~4.7 nm/min. By comparison, the WER of the thermal oxide film is approximately 2.2 nm/min. The WER of the silicon oxide deposited using bis(disilylamino)silane is approximately 1.9~2.1 times of that of thermal oxide film, demonstrating high quality, silicon oxide can be achieved using bis(disilylamino)silane. By comparison, the WER of silicon oxide deposited from trisilylamine (TSA) was about 2.2~2.5 times of thermal oxide.

Example 2: Deposition of Silicon Carbonitride Films Using 1,1,3,3,5,5-Hexamethylcyclotrisilazane Formula IV A number of silicon carbonitride films were deposited using 1,1,3,3,5,5-Hexamethylcyclotrisilazane as a precursor onto 8 inch silicon substrates and patterned substrates to compare the flowability.

Of the flowable silicon carbonitride films deposited by 1,1,3,3,5,5-hexamethylcyclotrisilazane, the process conditions used to provide the most favorable film properties were as follows: 1,1,3,3,5,5-hexamethylcyclotrisilazane flow (ranging from 800-1500 mg/min); He (ranging from 100~300 sccm); Pressure (ranging from 4~10 torr); RF (ranging from 100~500 W); and Temperature (ranging from 30~40° C.). Table 2 shows the deposition conditions for a selected flowable film deposition using 1,1,3,3,5,5-Hexamethylcyclotrisilazane:

TABLE 2

| Power (W) | Spacing (mils) | Pressure (Torr) | 1,1,3,3,5,5-Hexamethylcyclotrisilazane (mg/min) | He (sccm) | Deposition Temp (° C.) |
|---|---|---|---|---|---|
| 400 | 200 | 5 | 1000 | 200 | 35 |

Figure 2A:
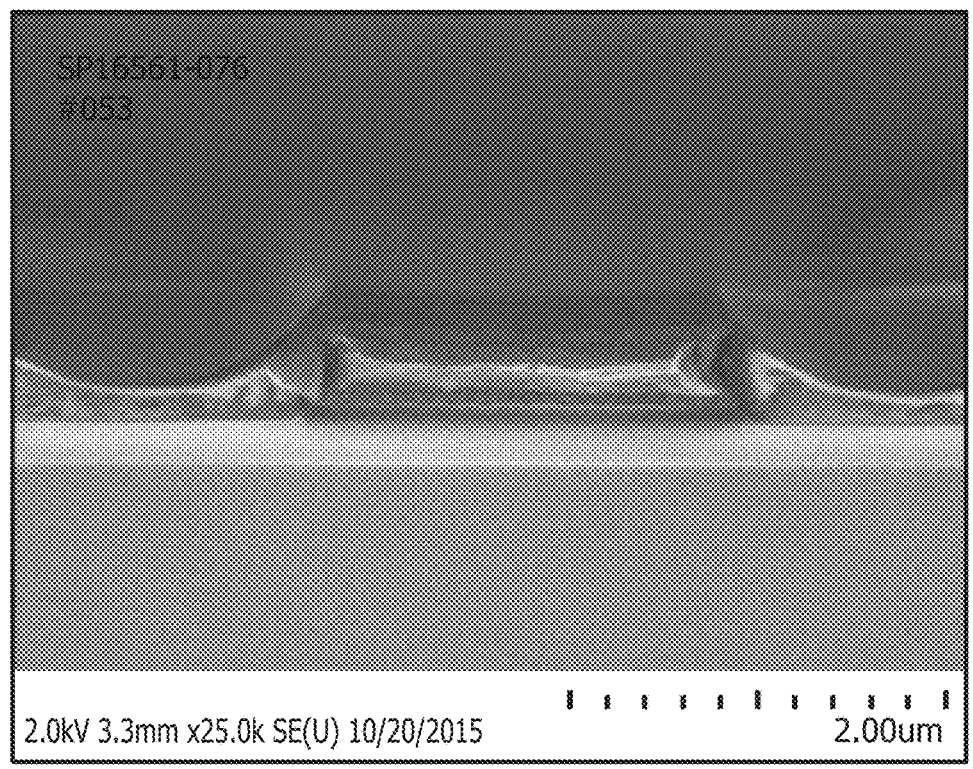
FIG. 2 provides a cross-sectional, scanning electron microscopy (SEM) image on the silicon carbonitride film deposited in Example 2 using the method and composition described herein and its impact on certain surface features of the substrate.
Figure 2B:
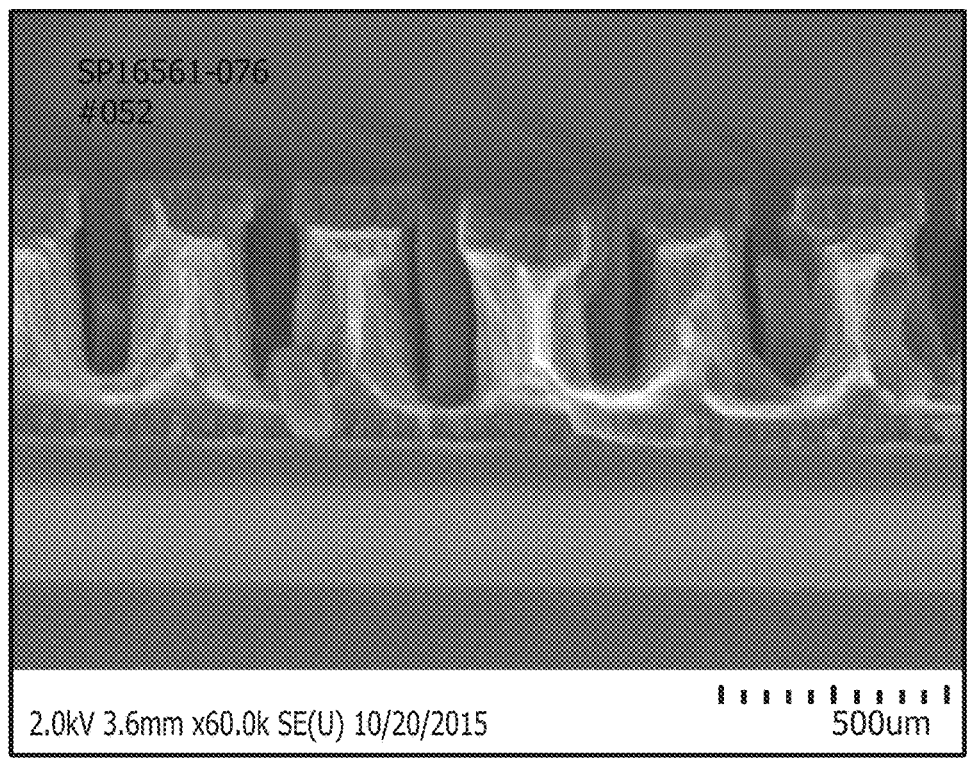

The deposited silicon carbonitride films were thermally treated at 250~400° C. The flowability and gap-fill effect on pattern wafers are shown in FIG. 2. A visual review of the cross-sectional SEM image on the larger surface feature showed good flowability in the trench which means that the features were void free, seamless, bottoms-up fill; the cross-sectional SEM image on the smaller surface feature indicates the bottom-up gap-filling effect of the flowable 1,1,3,3,5,5-Hexamethylcyclotrisilazane film.

The invention claimed is:
1. A composition, comprising:
at least one silicon-containing compound from among the compounds selected from the group consisting of:

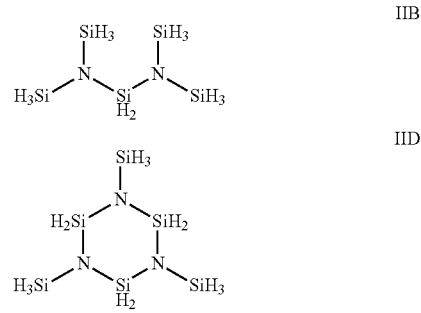

wherein substituent R is each independently selected from a hydrogen atom; a halide atom; a linear $C_1$ to $C_{10}$ alkyl group; a branched $C_3$ to $C_{10}$ alkyl group; a linear or branched $C_3$ to $C_{12}$ alkenyl group; a linear or branched $C_3$ to $C_{12}$ alkynyl group; a $C_4$ to $C_{10}$ cyclic alkyl group; and a $C_6$ to $C_{10}$ aryl group; and wherein the composition is configured to form a silicon-containing film on a substrate having two or more adjacent surface features;

wherein the silicon-containing film has a post-thermal anneal wet etch rate that is between 4.2 and 4.7 nanometers per minute; and wherein the silicon-containing film is seamless between the two or more adjacent surface features.

2. The composition of claim 1 further comprising at least one solvent selected from the group consisting of ether, tertiary amine, alkyl hydrocarbon, aromatic hydrocarbon, and tertiary aminoether.

3. The composition of claim 1 further comprising at least one solvent selected from the group consisting of octane, ethylcyclohexane, cyclooctane, and toluene.

4. The composition of claim 1 wherein the at least one silicon-containing compound is substantially free of halide ions.

5. The composition of claim 1 wherein the at least one silicon-containing compound is substantially free of metal ions.

6. The composition of claim 1 wherein the at least one silicon-containing compound comprises less than 5 ppm of halide ions.

7. The composition of claim 6 wherein the at least one silicon-containing compound comprises less than 5 ppm of metal ions.

8. The composition of claim 7 wherein the at least one silicon-containing compound comprises less than 3 ppm of metal ions.

9. The composition of claim 1 wherein the at least one silicon-containing compound comprises less than 3 ppm of halide ions.

10. The composition of claim 1 wherein the at least one silicon-containing compound comprises 0 ppm of halide ions.

11. The composition of claim 10 wherein the at least one silicon-containing compound comprises less than 5 ppm of metal ions.

12. The composition of claim 11 wherein the at least one silicon-containing compound comprises less than 3 ppm of metal ions.

* * * * *